US010435596B2

(12) United States Patent
Cho et al.

(10) Patent No.: US 10,435,596 B2
(45) Date of Patent: Oct. 8, 2019

(54) PRESSURE-SENSITIVE ADHESIVE COMPOSITION

(71) Applicant: LG CHEM, LTD., Seoul (KR)

(72) Inventors: Yoon Gyung Cho, Daejeon (KR); Hyun Jee Yoo, Daejeon (KR); Kyung Yul Bae, Daejeon (KR); Suk Ky Chang, Daejeon (KR); Jung Sup Shim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 628 days.

(21) Appl. No.: 14/654,265

(22) PCT Filed: Sep. 24, 2014

(86) PCT No.: PCT/KR2014/008902
§ 371 (c)(1),
(2) Date: Jun. 19, 2015

(87) PCT Pub. No.: WO2015/046881
PCT Pub. Date: Apr. 2, 2015

(65) Prior Publication Data
US 2015/0329747 A1 Nov. 19, 2015

(30) Foreign Application Priority Data

Sep. 24, 2013 (KR) .................. 10-2013-0113533

(51) Int. Cl.
*H01L 51/54* (2006.01)
*C09J 123/20* (2006.01)
*C08K 3/34* (2006.01)
*H01L 51/00* (2006.01)
*C09J 11/02* (2006.01)
*C09J 7/10* (2018.01)
*H01L 51/52* (2006.01)
*H01L 51/56* (2006.01)

(52) U.S. Cl.
CPC .............. *C09J 123/20* (2013.01); *C08K 3/34* (2013.01); *C09J 7/10* (2018.01); *C09J 11/02* (2013.01); *H01L 51/004* (2013.01); *C09J 2201/622* (2013.01); *C09J 2203/326* (2013.01); *C09J 2205/102* (2013.01); *H01L 51/5253* (2013.01); *H01L 51/56* (2013.01); *H01L 2924/0002* (2013.01)

(58) Field of Classification Search
CPC ..... C09J 7/00; C09J 11/00; C09J 11/02; C09J 123/00; C09J 123/18; C09J 123/20; C09J 201/00; C09J 2201/60; C09J 2201/622; C09J 2203/00; C09J 2203/30; C09J 2203/326; C09J 2205/00; C09J 2205/10; C09J 2205/102; C08K 3/00; C08K 3/16; C08K 3/34; C08L 101/00; H01L 2924/00; H01L 2924/0002; H01L 51/0032; H01L 51/004; H01L 51/50; H01L 51/5253; H01L 51/56

USPC ....... 428/690, 691, 917, 411.4, 336; 427/58, 427/66; 313/500–512; 257/40, 88–104, 257/E51.001–E51.052; 252/301.16–301.35
See application file for complete search history.

(56) References Cited

U.S. PATENT DOCUMENTS

| 7,985,821 | B2 | 7/2011 | Lejeune et al. | |
|---|---|---|---|---|
| 2006/0100299 | A1* | 5/2006 | Malik | C08G 59/18 522/31 |
| 2007/0267133 | A1* | 11/2007 | Matano | C09J 7/20 156/272.2 |
| 2009/0047500 | A1* | 2/2009 | Maeda | C08K 7/28 428/325 |
| 2010/0239778 | A1* | 9/2010 | Erwin | B01J 4/02 427/508 |
| 2011/0036496 | A1* | 2/2011 | Keite-Telgenbuscher et al. | C09J 153/025 156/326 |
| 2011/0105637 | A1* | 5/2011 | Fujita | C08L 23/22 522/120 |
| 2014/0318707 | A1 | 10/2014 | Cho et al. | |
| 2014/0377554 | A1 | 12/2014 | Cho et al. | |
| 2015/0011784 | A1 | 1/2015 | Aoki et al. | |
| 2015/0188085 | A1 | 7/2015 | Yoo et al. | |

FOREIGN PATENT DOCUMENTS

| CN | 1276000 A | 12/2000 |
|---|---|---|
| CN | 101410438 A | 4/2009 |
| CN | 102234487 A | 11/2011 |
| CN | 103154176 A | 6/2013 |
| EP | 2767566 A1 | 8/2014 |
| EP | 2781568 A1 | 9/2014 |
| JP | 2001-055551 A | 2/2001 |
| JP | 2004307787 A | 11/2004 |
| JP | 2005-298703 A | 10/2005 |
| JP | 2008-266496 A | 11/2008 |
| JP | 2009-524727 A | 7/2009 |
| JP | 2010-251117 A | 11/2010 |
| JP | 2010-260964 A | 11/2010 |
| JP | 2011-68718 A | 4/2011 |
| JP | 2011231179 A | 11/2011 |
| JP | 2012-7090 A | 1/2012 |
| JP | 2012-528919 A | 11/2012 |

(Continued)

OTHER PUBLICATIONS

Machine translation of JP2010-251117. Year of publication: 2010.*

*Primary Examiner* — Andrew K Bohaty
(74) *Attorney, Agent, or Firm* — Dentons US LLP

(57) ABSTRACT

The present invention relates to a pressure-sensitive adhesive composition and a pressure-sensitive adhesive film including the same, and provides a pressure-sensitive adhesive composition and a pressure-sensitive adhesive film which may prevent damage to an element from moisture contained in the composition, ionic substances, and other foreign substances, and effectively block electrochemical corrosion, thereby improving a lifetime and durability of an organic electronic device.

14 Claims, 1 Drawing Sheet

(56) References Cited

FOREIGN PATENT DOCUMENTS

| | | |
|---|---|---|
| JP | 2013-511410 A | 4/2013 |
| JP | 1020130055420 A | 5/2013 |
| KR | 10-2013-0055420 A | 5/2013 |
| WO | WO 2012052429 A1 * | 4/2012 ............ C09J 123/20 |
| WO | 2012/067902 A1 | 5/2012 |
| WO | 2013/073846 A1 | 5/2013 |
| WO | 2013/073847 A1 | 5/2013 |
| WO | 2013/103281 A1 | 7/2013 |
| WO | 2013/103284 A1 | 7/2013 |
| WO | 2013/115137 A1 | 8/2013 |
| WO | 2013/115250 A1 | 8/2013 |
| WO | 2013/137621 A1 | 9/2013 |

* cited by examiner

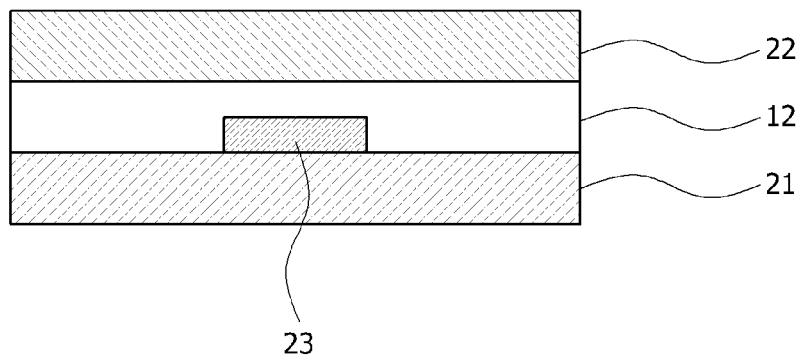

PRESSURE-SENSITIVE ADHESIVE COMPOSITION

This application is a National Stage Application of International Application No. PCT/KR2014/008902, filed Sep. 24, 2014, and claims the benefit of Korean Application No. 10-2013-0113533, filed Sep. 24, 2013, all of which are hereby incorporated by reference in their entirety for all purposes as if fully set forth herein.

BACKGROUND

1. Field of the Invention

The present invention relates to a pressure-sensitive adhesive composition, a pressure-sensitive adhesive film including the same, and an organic electronic device including the same.

2. Discussion of Related Art

Organic electronic devices (OEDs) are devices including an organic material layer generating a flow of charges using holes and electrons, and for example, include a photovoltaic device, a rectifier, a transmitter, an organic light emitting diode (OLED), and so forth.

Among OEDs, an OLED has less power consumption and a higher response speed, and forms a thinner display device or light than a conventional light source. Further, an OLED has excellent space utilization, and is expected to be applied in a variety of fields including various types of portable devices, monitors, notebook computers and TVs.

A major problem in expanding compatibility and use of OLEDs is durability. Organic materials and metal electrodes included in the OLED are too easily oxidized by external factors such as moisture, etc. Therefore, a product including an OLED is very sensitive to environmental factors. Accordingly, there is a need for development of encapsulants to prevent penetration of oxygen or moisture from an external environment with respect to an OED such as an OLED, etc. On the other hand, in an encapsulant applied in an OED, organic volatile substances contained in the encapsulant itself may affect an organic light emitting material or an electrode part, and thus effective control of the organic volatile substances is required.

SUMMARY OF THE INVENTION

The present invention is directed to providing a pressure-sensitive adhesive composition capable of effectively controlling moisture, ionic substances, and other foreign substances which enter an organic electronic device, resulting in damage to an element and electrochemical corrosion, and also capable of improving the lifetime and durability of the organic electronic device, and a pressure-sensitive adhesive film including the pressure-sensitive adhesive composition.

Hereinafter, exemplary embodiments of the present invention will be described in detail in conjunction with the accompanying drawing. Further, in the description of the present invention, general functions or constitutions well known in the related art are omitted. Further, the accompanying drawing is a schematic view for the purpose of understanding of the present invention, in which parts unrelated to the description are omitted for clarity of explanation. In the drawing, a thickness was expanded for a clear expression of many layers and areas, and the scope of the present invention is not limited to the thickness, size, ratio, or the like shown in the drawing.

A pressure-sensitive adhesive composition and a pressure-sensitive adhesive film including the same according to an embodiment of the present invention may be applied to encapsulate an entire surface of an organic electronic element of an organic electronic device. Further, the pressure-sensitive adhesive film may have a single-layered or multi-layered structure.

In the present disclosure, the term "organic electronic device" denotes a product or device which has an element including an organic material layer generating a flow of charges using holes and electrons between a pair of electrodes opposite to each other, and examples thereof include a photovoltaic device, a rectifier, a transmitter, an organic light emitting diode (OLED), and so forth, but are not limited thereto. In the embodiment of the present invention, the organic electronic device may be an OLED.

According to an aspect of the present invention, there is provided an exemplary pressure-sensitive adhesive composition which may include a pressure-sensitive adhesive resin, and satisfy the following Equation 1 or 2.

$$X \leq 1000 \text{ ppm} \qquad \text{[Equation 1]}$$

$$Y \leq 250 \text{ ppm}, \qquad \text{[Equation 2]}$$

In Equation 1, X is an amount of volatile organic compounds which is measured by preparing a film with the composition, maintaining 50 mg of the film sample at 80° C. for 30 minutes, and using purge and trap-gas chromatography/mass spectrometry. Further, in Equation 2, Y is an amount of ionic substances contained in the composition, which is obtained by preparing a film with the composition, and measuring 50 mg of the film sample according to ASTM D 7359:2008. In an embodiment, a pressure-sensitive adhesive composition according to the exemplary embodiment of the present invention may satisfy both of Equations 1 and 2.

In the detailed embodiment of the present invention, a moisture content of a film sample formed of the pressure-sensitive adhesive composition may be 0.01 wt % or more, and the moisture content of the film sample is measured according to ASTM D3451-06 (2012) (Standard Guide for Testing Coating Powders and Powder Coatings by Coulometric Karl Fischer Titration) after preparing a film with the pressure-sensitive adhesive composition, and maintaining 50 mg of the film sample under conditions of 25° C. and a relative humidity of 50% for 24 hours. That is, in Equation 1, X may be a measured amount of volatile organic compounds volatilized from components, which have a moisture content of 0.01 wt % or more as measured after maintaining the film sample of the pressure-sensitive adhesive composition under conditions of 25° C. and a relative humidity of 50% for 24 hours, among the components of the pressure-sensitive adhesive composition. Specifically, X may be an amount of volatile organic compounds volatilized after maintaining the pressure-sensitive adhesive composition which satisfies the above conditions at 150° C. for 1 hour (purge and trap). In the above descriptions, the upper limit of the moisture content may be 1 wt % or less, but is not particularly limited.

In the present disclosure, the term "component of pressure-sensitive adhesive composition" may denote a raw material which is a base of the pressure-sensitive adhesive composition. In the embodiment, the component of the pressure-sensitive adhesive composition may be a pressure-sensitive adhesive resin, a photoinitiator, a tackifier resin, a silane coupling agent, a polyfunctional acrylate or an organic solvent as will be described below, but is not limited thereto, and is not particularly limited as long as it is a material forming the pressure-sensitive adhesive composition.

The pressure-sensitive adhesive composition according to the embodiment of the present invention may control damage to an element by a final composition, by limiting volatile materials contained in substances which may contain moisture indirectly, deliver moisture through volatilization, or be volatilized and damage an organic element. Since moisture may result in the worst damage to the element of the organic electronic device, physical and chemical damage to the organic electronic device may be prevented by controlling moisture.

In the above description, X, which is an amount of volatile organic compounds, was measured using a commonly used volatile organic compound (VOC) analyzer. More specifically, the amount of a volatile organic compound, which is volatilized through purge and trap after about 50 mg of the film sample is maintained at 80° C. for 30 minutes with toluene as a standard reagent, may be 1000 ppm or less, 900 ppm or less, 800 ppm or less, 700 ppm or less, 600 ppm or less, 500 ppm or less, 300 ppm or less, or 200 ppm or less. Further, Y, which is an amount of ionic substances contained in the pressure-sensitive adhesive composition and measured through the ASTM D 7359:2008 measurement method, may be 250 ppm or less, 230 ppm or less, 220 ppm or less, 200 ppm or less, 180 ppm or less, or 150 ppm or less. In the embodiment of the present invention, physical and chemical damage to the organic electronic device may be prevented by controlling a total amount of the volatile organic compounds and a total amount of the ionic substances contained in the pressure-sensitive adhesive composition as described above. More specifically, acid or base ionic substances may cause corrosion of wires in the organic electronic device, thereby resulting in electrochemical corrosion of the organic electronic device and occurrence of dark spots.

In the present disclosure, the term "volatile organic compound (VOC)" may be defined as all organic compounds present in a gas phase in the atmosphere. "VOC" is a common term used to denote all organic materials which may be present in a gas phase at room temperature and atmospheric pressure such as hydrocarbons composed only of carbon and hydrogen, halogenated hydrocarbons, hydrocarbons containing nitrogen or sulfur, and the like, and may include semi-volatile organic compounds in a broader sense. For example, VOCs may denote organic solvents, by-products generated from pyrolysis of a curing agent, by-products generated from an addition reaction, etc.

In the present disclosure, the term "purge and trap (P&T)" may denote a VOC-preprocessing device or method, delivering minute amounts of VOCs that are extracted and concentrated during gas chromatography (GC) or gas chromatography/mass spectrometry (GC/MS). In a process used, a VOC-containing sample is put into a small airtight container, and then VOC materials of the sample are purged using a carrier gas and moved to a trap. In the trap, VOCs are collected, and heated again to pass through to GC.

In the present disclosure, GC/MS denotes an analytical device or method for separating and analyzing contents of a solution for various specimens. GC/MS includes a combination of GC used to separate a variety of compounds and MS used to measure an atomic mass of a substance entering from GC. Retention time and mass vary depending on types of the compounds. Since GC/MS is connected to computer software storing a library of a specific form of compounds, types of the substances as well as a concentration thereof are identified through comparison with the library in which compounds in a solution may be determined. A successive investigation after determining presence of the compounds is usually performed through GC to analyze a specific material.

The VOC according to the embodiment of the present invention may be a substance having a vapor pressure of 0.01 psi or more, 0.015 psi or more, 0.02 psi or more, or 0.025 psi or more. Since all materials having a high-vapor pressure and volatility are VOCs, the upper limit of the vapor pressure is not particularly limited, but may be 1 psi or less. Further, the VOC according to the embodiment of the present invention may have a boiling point of 200° C. or less, 150° C. or less, 120° C. or less, 115° C. or less, or 100° C. or less, and the lower limit thereof may be 50° C. or more, but is not particularly limited thereto.

In the present disclosure, the term "ionic substance" is not particularly limited as long as the substance is capable of causing wire corrosion of an organic electronic device. For example, the ionic substance may be halogen ions, and may be chlorine ions. As the ionic substance, halogen ions may result in electrochemical corrosion of the organic electronic device, and thus damage to the organic electronic device may be prevented by controlling the content of the halogen ions.

In the embodiment, the pressure-sensitive adhesive composition includes the pressure-sensitive adhesive resin. The pressure-sensitive adhesive resin may include components having a water vapor transmission rate (WVTR) of 50 g/m$^2$·day or less, or 45 g/m$^2$·day or less. The WVTR may denote a WVTR of a pressure-sensitive adhesive resin, and the WVTR is obtained after the pressure-sensitive adhesive resin is formed to be a film type having a thickness of 100 μm, and measured in a thickness direction of the film under conditions of 100° F. and a relative humidity of 100%. The film, which exhibits an excellent moisture barrier property, may be provided by controlling the WVTR to be in the range described above. The lower the WVTR of the pressure-sensitive adhesive resin is, the higher the moisture barrier property thereof is, and thus the lower limit of the WVTR is not particularly limited. For example, the lower limit of the WVTR of the pressure-sensitive adhesive resin may be 0 g/m$^2$·day or 0.01 g/m$^2$·day.

In the embodiment, the components contained in the pressure-sensitive adhesive resin may satisfy all the ranges of the WVTR described above. When the pressure-sensitive adhesive resin includes the components having the WVTRs in the above range, the film having a superior moisture barrier property, water repellency, or the like may be provided.

As the component of pressure-sensitive adhesive resin, any resin well known in the related art may be utilized without limitation as long as the resin satisfies the aforementioned WVTR. Further, when the resin does not satisfy the aforementioned WVTR, but the combination thereof satisfies the aforementioned WVTR, the combination of the resin may be used as the component of the pressure-sensitive adhesive resin. In the present disclosure, the term "component of pressure-sensitive adhesive resin" may denote a base resin which forms the pressure-sensitive adhesive resin. The base resin indicates the resin being used to embody primary physical properties of the pressure-sensitive adhesive resin, and having the composition in which arbitrary components such as additives, or the like are excluded. In the embodiment, when an additive such as a tackifier is included in the pressure-sensitive adhesive resin, the base resin may denote the resin having the composition in which the tackifier is excluded.

Examples of the pressure-sensitive adhesive resin in the embodiment of the present invention may include, for example, a styrene-based resin, a polyolefin-based resin, a thermoplastic elastomer, a polyoxyalkylene-based resin, a polyester-based resin, a polyvinyl chloride-based resin, a polycarbonate-based resin, a polyphenylene sulfide-based resin, a polyamide-based resin, an acrylate-based resin, an epoxy-based resin, a silicone-based resin, a fluorine-based resin, or mixtures thereof. In consideration of control of ionic substances and VOCs, the pressure-sensitive adhesive resin according to the embodiment of the present invention may be the resin of which a content of halogen ions is less than 300 ppm, 290 ppm or less, 280 ppm or less, 270 ppm, 260 ppm or less, or 250 ppm or less as measured according to ASTM D 7359:2008. By using the resin of which a content of halogen ions is controlled as described above, wire corrosion of an organic electronic element may be prevented, or dark spot generation due to electrochemical corrosion of the organic electronic device may be prevented.

As the styrene-based resin in the above description, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer, or mixtures thereof may be exemplified.

As the olefin-based resin, for example, a high-density polyethylene-based resin, a low-density polyethylene-based resin, a polypropylene-based resin, or mixtures thereof may be exemplified.

As the thermoplastic elastomer, for example, an ester-based thermoplastic elastomer, an olefin-based thermoplastic elastomer, mixtures thereof, or the like may be used. Among them, a polybutadiene resin, a polyisobutene resin, or the like may be used as the olefin-based thermoplastic elastomer.

As the polyoxyalkylene-based resin, for example, a polyoxymethylene-based resin, a polyoxyethylene-based resin, mixtures thereof, or the like may be exemplified. As the polyester-based resin, for example, a polyethylene terephthalate-based resin, a polybutylene terephthalate-based resin, mixtures thereof, or the like may be exemplified. As the polyvinyl chloride-based resin, for example, polyvinylidene chloride or the like may be exemplified. As the hydrocarbon mixture, for example, hexatriacotane, paraffin, or the like may be exemplified.

As the polyamide-based resin, for example, nylon or the like may be exemplified. As the acrylate-based resin, for example, a polybutyl(meth)acrylate or the like may be exemplified. As the epoxy-based resin, for example, a bisphenol type such as a bisphenol A type, a bisphenol F type, a bisphenol S type, hydrogenated products thereof, or the like; a novolac type such as a phenol novolac type, a cresol novolac type, or the like; a nitrogen-containing ring type such as a triglycidyl isocyanurate type, a hydantoin type, or the like; an alicyclic type; an aliphatic type; an aromatic type such as a naphthalene type, a biphenyl type, or the like; a glycidyl type such as a glycidyl ether type, a glycidylamine type, a glycidyl ester type, or the like; a dicyclo type such as a dicyclopentadiene type, or the like; an ester type; an etherester type, mixtures thereof, and so on may be exemplified.

As the silicone-based resin, for example, polydimethylsiloxane, or the like may be exemplified. Further, as the fluorine-based resin, a polytrifluoroethylene resin, a polytetrafluoroethylene resin, a polychlorotrifluoroethylene resin, a polyhexafluoropropylene resin, polyvinylidene fluoride, polyvinyl fluoride, poly(fluorinated ethylene-propylene), mixtures thereof, or the like may be exemplified.

When the above listed resins are used, the resin may be grafted with, for example, maleic anhydride and the like, may be copolymerized with another of the listed resins, or monomers for preparing resins, or may be denaturalized by other compounds. Examples of the other compounds may include a carboxyl-terminated butadiene-acrylonitrile copolymer or the like Further, the above listed resins may include, for example, as a resin that may exhibit an adhesive property by curing, a resin having at least one functional group or part that may be cured by heat such as a glycidyl group, an isocyanate group, a hydroxyl group, a carboxyl group, an amide group, and the like, or may include a resin having at least one functional group or part that may be cured by irradiation with active energy rays such as an epoxide group, a cyclic ether group, a sulfide group, an acetal group, a lactone group, and the like.

In the detailed embodiment, the pressure-sensitive adhesive resin may include a polyisobutylene resin. The polyisobutylene resin is hydrophobic, and thus may exhibit a low WVTR and surface energy. More specifically, examples of the polyisobutylene resin may include, for example, a homopolymer of an isobutylene monomer; a copolymer obtained by copolymerizing the isobutylene monomer with other polymerizable monomers, and so forth. Here, the other monomers which may be polymerized with the isobutylene monomer may include 1-butene, 2-butene, isoprene, butadiene, or the like. When the copolymer is used, physical properties such as processability and the degree of cross-linking may be maintained, thereby minimizing generation of dark spots when applied to the organic electronic device.

In the pressure-sensitive adhesive resin, a base resin which has a weight-average molecular weight (Mw) at which molding in a film form is possible may be used. In the embodiment, the range of the weight-average molecular weight at which molding in the film form is possible may be about 30 thousand to 2 million, 100 thousand to 1.5 million or 100 thousand to 1 million. The term "weight-average molecular weight" in this application refers to a conversion value of a standard polystyrene measured through gel permeation chromatography (GPC).

Further, as the pressure-sensitive adhesive composition, one type or two or more types of the composition described above may be used. When two or more types are used, at least two types of the different kind of resins, the resins having a different weight-average molecular weight, or the resins of which a type and weight-average molecular weight are both different may be used.

The pressure-sensitive adhesive composition according to the embodiment of the present invention may include one or more selected from the group consisting of a photoinitiatior, a tackifier resin, a silane coupling agent, a polyfunctional acrylate, and an organic solvent.

In the embodiment of the present invention, most of the substances which enter an organic electronic device as VOCs and result in damage to an element and electrochemical corrosion are organic solvents, and thus an organic volatilization amount of the pressure-sensitive adhesive composition and generation of trace elements may be reduced by controlling the organic solvents. The boiling point of the organic solvent may be in a range of 100° C. or less, 95° C. or less, 90° C. or less, 85° C. or less, or 80° C. or less, and the lower limit thereof may be 50° C. or more, but is not particularly limited. More specifically, the organic solvent may include hydrocarbon solvents, alcohols, ester compounds, ketones or ether compounds. For example, examples of the solvents that may be used in the embodiment of the present invention may include one type or mixtures of at least two types of methyl ethyl ketone (MEK), acetone, toluene, dimethyl formamide (DMF), methyl cellosolve (MCS), tetra-hydrofuran (THF), N-methyl pyrrolidone (NMP), ethyl cellosolve (ECS), or the like, but are not limited thereto.

In the embodiment of the present invention, the pressure-sensitive adhesive composition may include a photoinitiatior at 0.01 to 20 parts by weight, 0.1 to 18 parts by weight, 0.3 to 15 parts by weight, 0.5 to 13 parts by weight, 0.8 to 11 parts by weight, 1.0 to 10 parts by weight, 1.5 to 9 parts by weight, or 2.0 to 8.5 parts by weight with respect to 100 parts by weight of a polyfunctional acrylate. When an amount of the photopolymerization initiator is less than 0.01 parts by weight, a curing speed of the pressure-sensitive adhesive resin is decreased, leading to an insufficient degree of crosslinking. Further, in some embodiments in which an amount of the photopolymerization initiator exceeds the range described above, amounts of outgassing from the pressure-sensitive adhesive resin may increase.

In an embodiment in which the pressure-sensitive adhesive composition includes the photopolymerization initiator, any photopolymerization initiator satisfying Equation 1 or 2 may be used without limitation. In general, a selection of the initiator may change depending on a specific resin partially included in the pressure-sensitive adhesive resin. However, since a cationic initiator may generate by-products through an addition reaction, the composition may not include a cationic initiator. For example, when the cationic initiator is used, a corrosive acid may be generated, and thus a photo-radical initiator may be preferably used.

Exemplary examples of the photo-radical initiator may include acetophenone, diethoxyacetophenone, 2-[4-(methylthio)-methyl-1-phenyl]-2-morpholino propanone, benzoin, benzoin ethyl ether, benzylmethyl ketal, benzophenone, benzylmethylbenzoyl formate, 2-ethylanthraquinone, thioxanthone, diethylthioxanthone, 2,4,6-trimethylbenzoyl-diphenyl-phosphine oxide (brand name: LUCIRIN TPO; available from BASF AG), 2,4,6-trimethylbenzoyl diphenylethoxy phosphine oxide (brand name: LUCIRIN TPO-L; available from BASF AG), bis(2,4,6-trimethyl benzoyl) phenyl phosphine oxide (brand name: IRGACURE 819; available from Ciba Geigy Co., Ltd.), 2-hydroxy-2-methyl-1-phenyl propan-1-one (brand name: DAROCURE 1173; available from Ciba Geigy Co., Ltd.), 4-(2-hydroxyethoxyl) phenyl (2-hydroxy-2-propyl) ketone (brand name: IRGACURE 2959; available from Ciba Geigy Co., Ltd.), 4-(2-acryloxyethoxyl)phenyl-(2-hydroxy-2-propyl) ketone, 1-hydroxycyclohexyl phenyl ketone (brand name: IRGACURE 184; available from Ciba Geigy Co., Ltd.), 1-(4-isopropylphenyl)-2-hydroxy-2-methylpropan-1-one, 1-(4-dodecylphenyl)-2-hydroxy-2-methylpropan-1-one, 2-methyl-2-morpholino(4-thiomethylphenyl)propan-1-one (brand name: IRGACURE 907; available from Ciba Geigy Co., Ltd.), 2-benzyl-2-dimethylamino-1-(4-morpholinophenyl)-butanone (brand name: IRGACURE 369; available from Ciba Geigy Co., Ltd.), N,N'-octamethylene bis acridine (brand name: ADEKA OPTOMER N1717; available from ADEKA Corporation), and acryloyl benzophenone (brand name: EBERCRYL P36; available from UCB Chemicals Co., Ltd.), but are not limited thereto.

In the embodiment, onium salts may be utilized due to a low level of metal ion pollution. The onium salts may include iodonium salts, and sulfonium and phosphonium complex salts, but are not limited thereto. Generally useful onium salts may be of the general formula $Y^+X^-$. $Y^+$ may include aryldialkylsulfonium, alkyldiarylsulfonium, triarylsulfonium, diaryliodonium and tetraaryl phosphonium cations, where each alkyl and aryl group may be substituted. The $X^-$ may include $PF_6^-$, $SbF_6^-$, $CF_3SO_3^-$, $(CF_3SO_2)_2N^-$, $(CF_3SO_2)_3C^-$, and $(C_6F_5)_4B^-$ anions.

The pressure-sensitive adhesive composition according to the embodiment of the present invention may further include a silane coupling agent. The silane coupling agent increases adhesion and adhesive stability of an adhesive, improves heat resistance and humidity resistance, and also enhances adhesion reliability when subjected to severe conditions for a long time. However, since the silane coupling agent generates by-products of the alcohol component under heat, it is preferable to minimize a content of the silane coupling agent within the scope of the objective of the present invention. As the silane coupling agent, for example, one type or mixtures of at least two types of gamma-glycidoxypropyl triethoxy silane, gamma-glycidoxypropyl trimethoxy silane, gamma-glycidoxypropyl methyldiethoxy silane, gamma-glycidoxypropyl triethoxy silane, 3-mercaptopropyl trimethoxy silane, vinyltrimethoxysilane, vinyltriethoxy silane, gamma-methacryloxypropyl trimethoxy silane, gamma-methacryloxy propyl triethoxy silane, gamma-aminopropyl trimethoxy silane, gamma-aminopropyl triethoxy silane, 3-isocyanato propyl triethoxy silane, gamma-acetoacetatepropyl trimethoxysilane, gamma-acetoacetatepropyl triethoxy silane, beta-cyanoacetyl trimethoxy silane, beta-cyanoacetyl triethoxy silane, acetoxyaceto trimethoxy silane, or the like may be used. It is preferable to use the silane coupling agent having an acetoacetate group or a beta-cyanoacetyl group, but is not limited thereto. The pressure-sensitive adhesive composition may include the silane coupling agent in a range of less than 2 parts by weight, 0.01 to 1.9 parts by weight, 0.01 to 1.8 parts by weight, 0.01 to 1.5 parts by weight, or 0.01 to 1.3 parts by weight with respect to 100 parts by weight of the pressure-sensitive adhesive resin. When the silane coupling agent is included at 2 parts by weight or more, dark spots may occur due to by-products of the alcohol component generated from the silane coupling agent, and bubble-occurrence frequency may increase upon bonding and curing.

In the embodiment of the present invention, the pressure-sensitive adhesive composition may further include a tackifier resin. As the tackifier resin, for example, a hydrogenated petroleum resin obtained by hydrogenation of the petroleum resin may be used. The hydrogenated petroleum resin may be a partially or fully hydrogenated petroleum resin, or a mixture thereof. The tackifier resin which has excellent compatibility with the pressure-sensitive adhesive resin and moisture barrier properties may be selected. Specific examples of the hydrogenated petroleum resin may include a hydrogenated terpene-based resin, a hydrogenated ester-based resin, a hydrogenated dicyclopentadiene-based resin, or the like. A weight-average molecular weight of the tackifier resin may be in a range of about 300 to 5,000, 350 to 3,000, 400 to 2,000 or 350 to 1,500. Content of the tackifier resin may be properly adjusted as necessary.

Further, the tackifier resin may be included at a ratio in a range of 5 to 100 parts by weight, 5 to 80 parts by weight, or 5 to 50 parts by weight with respect to 100 parts by weight of the pressure-sensitive adhesive resin.

Further, in an embodiment, the tackifier resin according to the embodiment of the present invention may have an acid value of 1 KOH mg/g or less, 0.9 KOH mg/g, 0.8 KOH mg/g, 0.7 KOH mg/g, 0.6 KOH mg/g, 0.4 KOH mg/g or 0.2

KOH mg/g in consideration of control of VOCs or ionic substances. When an acid value of the tackifier resin is more than 1 KOH mg/g, ionic substances or the like may enter an organic electronic device as VOCs and damage an element, and materials capable of causing electrochemical corrosion may be generated.

In the embodiment of the present invention, the pressure-sensitive adhesive composition may further include a polyfunctional acrylate in addition to the aforementioned pressure-sensitive adhesive resin. For example, the polyfunctional acrylate as described above may serve to increase a storage modulus of the pressure-sensitive adhesive composition through a reaction with the aforementioned photoinitiatior.

In the embodiment of the present invention, types of polyfunctional acrylates that may be used are not particularly limited, and may be properly selected by those skilled in the art.

In the embodiment of the present invention, one type or mixtures of at least two types of the well-known polyfunctional acrylates may be used. In consideration of optical properties such as compatibility and haze, acrylates having 2 functional groups or more or 3 functional groups may be preferably used to embody more superior durability, but the scope of the present invention is not limited thereto.

In the pressure-sensitive adhesive composition according to the embodiment of the present invention, the polyfunctional acrylate may be included in a range of 1 to 50 parts by weight, 2 to 40 parts by weight, or 3 to 30 parts by weight with respect to 100 parts by weight of the pressure-sensitive adhesive resin. When content of the polyfunctional acrylate is less than 1 part by weight, durability under conditions of high temperature and humidity may decrease. When content of the polyfunctional acrylate is more than 50 parts by weight, optical properties and unreacted materials may remain, and adhesive force may decrease.

The pressure-sensitive adhesive composition according to the embodiment of the present invention may include a moisture absorbent as necessary. The term "moisture absorbent" may be used as a collective term for components capable of absorbing or removing moisture or water vapor entering from the outside through a physical or chemical reaction. That is, the moisture absorbent denotes a moisture-reactive absorbent or physical absorbent, and mixtures thereof may also be used.

The moisture-reactive absorbent absorbs moisture or water vapor by chemically reacting with water vapor, moisture or oxygen entering a pressure-sensitive adhesive film including the pressure-sensitive adhesive composition. The physical absorbent may lengthen the traveling path of moisture or water vapor penetrating into an encapsulating structure to be described below, thereby suppressing penetration thereof, and may maximize barrier properties with respect to moisture and water vapor through a matrix structure of the pressure-sensitive adhesive resin and interaction with the moisture-reactive absorbent, etc.

Types of the moisture absorbent that may be used in the present invention are not particularly limited, for example, the moisture-reactive absorbent may include one type or mixtures of at least two types of metal powders such as alumina or the like, a metallic oxide, metal salts, phosphorus pentoxide ($P_2O_5$), or the like, and the physical absorbent may include silica, zeolite, titania, zirconia, montmorillonite, or the like.

Specific examples of the metallic oxide in the above may include, but are not limited, lithium oxide ($Li_2O$), sodium oxide ($Na_2O$), barium oxide (BaO), calcium oxide (CaO), magnesium oxide (MgO), or the like, and examples of the metal salts may include, but are not limited, sulfates such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), nickel sulfate ($NiSO_4$), or the like; metal halides such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), magnesium iodide ($MgI_2$), or the like; or metal chlorates such as barium perchlorate ($Ba(ClO_4)_2$), magnesium perchlorate ($Mg(ClO_4)_2$), or the like.

In the embodiment of the present invention, the moisture absorbent such as the metallic oxide, or the like, may be properly processed and mixed with the composition. For example, a pressure-sensitive adhesive film which is a film type prepared from the aforementioned pressure-sensitive adhesive composition may be formed to have a shape of a thin film having a thickness of 30 μm or less according to types of the organic electronic device to be applied, and here, a milling process of the moisture absorbent may be required. The milling process of the moisture absorbent may include processes such as three roll mill, bead mill, ball mill, etc.

The pressure-sensitive adhesive composition according to the embodiment of the present invention may include the moisture absorbent at an amount in a range of 0 to 100 parts by weight, 1 to 90 parts by weight, 5 to 80 parts by weight, or 10 to 50 parts by weight with respect to 100 parts by weight of the pressure-sensitive adhesive resin. Although the moisture absorbent, as an optional component, may not be included, a crosslinked material may exhibit superior moisture and water vapor barrier properties by preferably controlling the moisture absorbent content to be included at 5 parts by weight or more. Further, by controlling the moisture absorbent content to be included at 100 parts by weight or less, the crosslinked material may exhibit excellent moisture barrier properties while forming an encapsulating structure of a thin film.

In the present disclosure, unless otherwise defined, a unit of "parts by weight" denotes a weight ratio between the components.

The pressure-sensitive adhesive composition according to the embodiment of the present invention may further include additives for improving durability of the cured material, such as a filler, a leveling agent, a dispersant, an antifoamer, a UV stabilizer, and an antioxidant, within a range in which a small amount of by-products from heat, unreacted materials, and materials generated from an addition reaction is formed upon VOC analysis.

The embodiment of the present invention also relates to a pressure-sensitive adhesive film including the pressure-sensitive adhesive composition described above.

A structure of the pressure-sensitive adhesive film according to the embodiment of the present invention is not particularly limited as long as the pressure-sensitive adhesive film includes the pressure-sensitive adhesive composition, but in an example, the pressure-sensitive adhesive film may have a structure including a base film or release film (which may hereinafter be referred to as a "first film"); and the pressure-sensitive adhesive composition formed on the base film or release film.

The pressure-sensitive adhesive film according to the embodiment of the present invention may further include a base film or release film formed on the pressure-sensitive adhesive composition (which may hereinafter be referred to as a "second film").

Specific examples of the first film that may be used in the embodiment of the present invention are not particularly limited. In the embodiment of the present invention, for example, a typical polymer film in the related art may be used as the first film. In the embodiment of the present invention, examples of the base or release film may include a polyethylene terephthalate (PET) film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acetate copolymer film, an ethylene-methyl acetate copolymer film, a polyimide film, or the like. Further, one or both sides of the base film or the release film may be subjected to proper release treatment in the embodiment of the present invention. Examples of a release agent used for release treatment of the base film may include alkyd-based, silicone-based, fluorine-based, unsaturated ester-based, polyolefin-based, and wax-based release agents, etc. Among these, alkyd-based, silicone-based, or fluorine-based release agents may be preferably used in terms of heat resistance, but the release agent is not limited thereto.

Further, types of the second film that may be used in the embodiment of the present invention (which may hereinafter be referred to as a "cover film") are not particularly limited either. For example, in the embodiment of the present invention, the same type of film as the first film or a different type of film from the first film may be used as the second film within the range in which the first film is exemplified as described above. Further, the second film may also be subjected to proper release treatment in the embodiment of the present invention.

In the embodiment of the present invention, the thickness of the base film or the release film (first film) is not particularly limited, and may be adjusted properly depending on a purpose. For example, a thickness of the first film may be in a range of 10 to 500 μm, preferably 20 to 200 μm, in the embodiment of the present invention. When the thickness of the first film is less than 10 μm, the base film may be easily deformed in a manufacturing process, and when the thickness of the first film is more than 500 μm, economic efficiency decreases.

Further, a thickness of the second film is not particularly limited either in the embodiment of the present invention. In the embodiment of the present invention, for example, a thickness of the second film may be set to be the same as that of the first film. Further, in consideration of processability, a thickness of the second film may be set to be relatively thinner than that of the first film.

A thickness of the pressure-sensitive adhesive composition included in the pressure-sensitive adhesive film according to the embodiment of the present invention is not particularly limited, and may be properly selected according to the following conditions in consideration of a purpose of the applied film.

In the embodiment of the present invention, a method of preparing the pressure-sensitive adhesive film as described above is not particularly limited. For example, the method of preparing the adhesive film may include a first step in which a coating solution containing the pressure-sensitive adhesive composition described above is coated on the base film or the release film; and a second step in which the coating solution applied in the first step is dried.

The method of preparing the pressure-sensitive adhesive film according to the embodiment of the present invention may further include a third step in which a base film or release film is additionally pressed onto the coating solution dried in the second step.

The first step according to the embodiment of the present invention includes preparing a coating solution by dissolving or dispersing the pressure-sensitive adhesive composition described above in a proper solvent. In this process, a content of the pressure-sensitive adhesive resin or the like contained in the coating solution may be properly controlled depending on a purpose.

Types of the solvent used for preparing the coating solution in the embodiment of the present invention are not particularly limited. However, when a drying time of the solvent is excessively prolonged or drying at high temperature is required, problems may occur in terms of workability or durability of the pressure-sensitive adhesive film, and thus the solvent having a volatilization temperature of 200° C. or less, 130° C. or less, or 100° C. or less may be preferably used. Examples of the solvent that may be used in the present invention may include, but are not limited to, one type or mixtures of at least two types of methyl ethylketone (MEK), acetone, toluene, dimethyl formamide (DMF), methyl cellosolve (MCS), tetra-hydrofuran (THF), N-methyl pyrrolidone (NMP), ethyl cellosolve (ECS), etc.

A method of applying the coating solution as described above onto the base film or the release film in the first step according to the embodiment of the present invention is not particularly limited, and for example, knife coating, roll coating, spray coating, gravure coating, curtain coating, comma coating, lip coating, or the like may be used without limitation.

The second step according to the embodiment of the present invention includes forming a pressure-sensitive adhesive layer containing the pressure-sensitive adhesive resin by drying the coating solution coated in the first step. That is, in the second step according to the embodiment of the present invention, the pressure-sensitive adhesive layer may be formed by heating, drying, and removing the coating solution applied onto the film. Here, a drying condition is not particularly limited, and for example, the drying may be performed at a temperature in a range of 70 to 200° C. for 1 to 30 minutes.

The method of preparing the pressure-sensitive adhesive film according to the embodiment of the present invention may further include the third step of pressing an additional base film or release film on the pressure-sensitive adhesive composition formed on the film following the second step.

In the third step according to the embodiment of the present invention as described above, the additional release film or base film (cover film or second film) may be pressed through hot-roll laminating or a pressing process after the pressure-sensitive adhesive composition is coated onto the film. Here, the third step may be performed by a hot-roll-laminating method to enable a continuous process and improve effectiveness, and the process may be performed at a temperature in a range of about 10 to 100° C. and a pressure in a range of about 0.1 to 10 kgf/cm$^2$.

In the embodiment, after the laminating process is performed at room temperature, a process of applying heat and pressure using an autoclave may be selectively added. Although laminating may be suitable for an encapsulating base, an autoclave process may be appropriate in terms of removing bubbles by bonding to the substrate.

According to another aspect of the present invention, there is provided an organic electronic device including a substrate 21; an organic electronic element 23 formed on the substrate 21; and the above-described pressure-sensitive adhesive film 12 encapsulating the organic electronic element 23. The pressure-sensitive adhesive film 12 may cover an entire surface of the organic electronic element 23.

In the embodiment of the present invention, the organic electronic element may be an organic light emitting diode.

The organic electronic device may further include a protective layer protecting the organic electronic element between the adhesive film and the organic electronic element.

The organic electronic device may further include a cover substrate 22 which covers an upper end of the pressure-sensitive adhesive film.

According to still another aspect of the present invention, there is also provided a method of preparing an organic electronic device, which includes applying the pressure-sensitive adhesive film containing the pressure-sensitive adhesive composition described above onto a substrate on which an organic electronic element is formed to cover the organic electronic element. In the embodiment, the production method may further include crosslinking or curing the pressure-sensitive adhesive film containing the pressure-sensitive adhesive composition.

Further, the pressure-sensitive adhesive film exhibits excellent transparency, and thus may maintain stability regardless of types of the organic electronic device such as a top emission type or bottom emission type.

In the present disclosure, the term "curing" may indicate that the pressure-sensitive adhesive composition according to the embodiment of the present invention is produced in the form of a pressure-sensitive adhesive by forming a crosslinked structure through a heat or UV irradiation process.

More specifically, a transparent electrode may be formed on a glass or polymer film used as a substrate using a method such as vacuum deposition, sputtering, or the like, and an organic material layer including a hole transport layer, a light-emitting layer, an electron transport layer, or the like may be formed on the transparent electrode. Subsequently, an electrode may be further formed on the organic material layer, and thereby an organic electronic element may be formed. Then, the pressure-sensitive adhesive film may be located to completely cover an entire surface of the organic electronic element that has undergone the process.

Subsequently, in a state in which the pressure-sensitive adhesive film is provided with fluidity by heat, the pressure-sensitive adhesive film may be pressed onto the organic electronic device using a laminating device or the like, and a resin in the pressure-sensitive adhesive film may be crosslinked.

In the embodiment, the pressure-sensitive adhesive film which is located to cover an entire surface of the organic electronic device may be transferred onto the cover substrate such as a glass or polymer film in advance. For example, transfer of the pressure-sensitive adhesive film to the cover substrate 34 may be performed while applying heat using a vacuum press, a vacuum laminator, and the like in a state in which the pressure-sensitive adhesive layer is in contact with the cover substrate after a first or second film is delaminated from the pressure-sensitive adhesive film. When the pressure-sensitive adhesive composition includes a heat curable pressure-sensitive adhesive resin and the curing reaction excessively occurs in the above process, the bonding strength or the adhesion force of the pressure-sensitive adhesive film may be reduced, and thus the process temperature may be controlled to about 100° C. or less and the process time may be controlled within less than 5 minutes.

The cover substrate on which the pressure-sensitive adhesive film is transferred may be located on the organic electronic device, the heat-and-press process may be performed, and thereby an encapsulating structure may be formed.

In the embodiment, the pressure-sensitive adhesive film may be cured. The curing process may be performed, for example, at a proper heat chamber or UV chamber according to the curing method of a curable pressure-sensitive adhesive resin. A condition of heat or active ray irradiation may be properly selected in consideration of stability of the organic electronic device and a curing property of the pressure-sensitive adhesive resin, and an autoclave process may be performed in order to increase pressing efficiency.

In the above descriptions, an example of the method of preparing the organic electronic device has been represented, but the organic electronic device may be manufactured using another method. For example, the manufacture of the device may be performed through the above-described process, but with an order or conditions of the process changed. For example, the pressure-sensitive adhesive film may not be transferred to the cover substrate in advance, but may be firstly transferred to the organic electronic element on the substrate, the cover substrate may be laminated, and then the curing process may be performed to form the encapsulating structure.

When the pressure-sensitive adhesive composition according to the embodiment of the present invention is applied to a film encapsulating the organic electronic device, the encapsulating film may protect the element, prevent damage to the element from moisture contained in the composition, ionic substances, and other foreign substances, and effectively block electrochemical corrosion, and thus a lifetime and durability of the organic electronic device may be improved.

EFFECTS

When the pressure-sensitive adhesive composition according to the embodiment of the present invention is applied to a film encapsulating the organic electronic device, the encapsulating film can protect the element, prevent damage to the element from moisture contained in the composition, ionic substances, and other foreign substances, and effectively block electrochemical corrosion, and thus a lifetime and durability of the organic electronic device can be improved.

BRIEF DESCRIPTION OF THE DRAWINGS

The drawing FIGURE is a cross-sectional view illustrating an encapsulating product of an organic electronic device according to an embodiment of the present invention.

DESCRIPTION OF REFERENCE NUMERALS

12: adhesive film
21: substrate
22: cover substrate
23: organic electronic element

DETAILED DESCRIPTION OF EXEMPLARY EMBODIMENTS

Hereinafter, the present invention will be described in detail in conjunction with exemplary examples according to the present invention and comparative examples not according to the present invention, but the scope of the present invention is not intended to be limited to the examples described below, and it will be apparent to those skilled in the art that various modifications can be made without departing from the spirit and scope of the invention.

Example 1

90 g of polyisobutylene (Mw 340 k, Cl 10 ppm>), 10 g of a tackifier resin (H-DCPD-based, s.p. 125° C., volatile 0.5 wt %>), 6 g of an acrylate (trimethylolpropane triacrylate), and 0.5 g of a photoinitiatior (2,2-dimethoxy-1,2-diphenylethan-1-one) were added with toluene such that solid fractions were generated at 20%, and stirred to prepare a coating solution.

The prepared solution was applied onto a release surface of a release PET film using a comma coater, and dried at 100° C. for 30 minutes, and then a pressure-sensitive adhesive film having a thickness of 50 μm was formed.

Example 2

A pressure-sensitive adhesive film was prepared in the same method as Example 1 except that a content of the photoinitiatior (2,2-dimethoxy-1,2-diphenylethan-1-one) was changed to 0.2 g, and the drying time was set to 10 minutes.

Comparative Example 1

A pressure-sensitive adhesive film was prepared in the same method as Example 1 except that a tackifier resin (SU90; Kolon Industries, Inc.) in which volatile organic compounds (VOCs) were detected through purge and trap-gas chromatography/mass spectrometry at 2 wt % or more during drying at 150° C. for 1 hour were used, and the drying time was set to 10 minutes.

Comparative Example 2

A pressure-sensitive adhesive film was prepared in the same method as Example 1 except that a tackifier resin product having an acid value of 5 KOH mg/g (REAGEM 5110; Parchem fine & specialty chemicals) was used, and the drying time was set to 10 minutes.

Comparative Example 3

A pressure-sensitive adhesive film was prepared in the same method as Example 1 except that a butyl rubber having a content of chlorine ions of 300 ppm or more as measured according to ASTM D 7359:2008 was used, and the drying time was set to 10 minutes.

Experimental Example 1: Total Volatile Organic Compounds (VOC) Measurement

Measurement device: Purge & Trap sampler-GC/MSD system (P & T: JAI JTD-505III, GC/MS: Agilent 7890B/5977A)

Samples coated with the films were weighed to approximate 50 mg, passed through purge and trap at 80° C. for 30 minutes, and a total amount of VOCs was measured through GC-MS. The measured volatilization amount was quantified using toluene as a standard reagent.

Experimental Example 2: Ionic Substance (Trace Element) and Acid Value Measurement Preprocessing of the samples weighed to about 50 mg and having films applied thereto was performed according to EN 50267-2-1 & 502672-2, a trace element was measured according to ASTM D 7395:2008, and an acid value was measured according to a method of ASTM D 974.

Evaluation Method: Dark Spot

An element available for a lighting test was deposited on a glass substrate. After the pressure-sensitive adhesive film on a coated sheet was heat laminated on the glass substrate for encapsulating, the film was vacuum-pressed for 3 minutes at a pressure of 5 kg/cm$^2$ while being heated at 80° C. on the substrate. The pressed sample was thermally cured at 100° C. for 2 hours in an oven. The thermally cured sample was observed under conditions of a constant temperature and humidity of 85° C. and 85% RH, and checked for dark spots. Through an observation for 300 hours, it was checked whether or not dark spots were generated on the sample.

Evaluation Method: Wire Corrosion, Bubble Formation and Damage to TFT

An element was deposited on a glass substrate. After the coated adhesive film on a sheet was heat laminated on the glass substrate for encapsulating, the film was vacuum-pressed for 3 minutes at a pressure of 5 kg/cm$^2$ while being heated at 80° C. on the substrate. The pressed sample was thermally cured at 100° C. for 2 hours in an oven. After applying the pressure-sensitive adhesive film on the organic electronic element as described above, the film was checked with the naked eye for wire corrosion, bubbles, and damage to the TFT.

TABLE 1

| | VOCs (ppm) | Ionic substances (ppm) | Dark spot | Etc. (wire corrosion and bubbles) |
|---|---|---|---|---|
| Example 1 | 89 | 59 | None | Good |
| Example 2 | 59 | 79 | None | Good |
| Comparative Example 1 | 1400 | 166 | None | Bubbles formed on pressing/curing |
| Comparative Example 2 | 230 | 269 | Generated | Wire corrosion |
| Comparative Example 3 | 156 | 341 | Generated | Damage to TFT |

In Example 1 in which the resin having a low content of halogen ions, and a tackifier resin having a low amount of VOCs and low acid value were used, VOCs and ionic substances were both effectively suppressed. On the other hand, in Comparative Example 1 using the tackifier resin in which a great amount of VOCs was detected, or in Comparative Example 2 using the tackifier resin having an acid value of 5 KOH mg/g, a great amount of VOCs or ionic substances was generated, resulting in generation of bubbles or wire corrosion. Further, in Comparative Example 3 in which the butyl rubber having a Cl content of 300 ppm or more was used, a great amount of ionic substances was generated, and thereby damage to the TFT was determined.

What is claimed is:

1. A pressure-sensitive adhesive film comprising a pressure-sensitive adhesive composition, the composition comprising a pressure-sensitive adhesive resin comprising a polyisobutylene resin, and a photoinitiator, and the film satisfying the following Equations 1 and 2:

$$X \leq 1000 \text{ ppm} \qquad \text{[Equation 1]}$$

$$Y \leq 250 \text{ ppm,} \qquad \text{[Equation 2]}$$

wherein X in Equation 1 is an amount of volatile organic compounds which is measured by maintaining 50 mg of the film at 80° C. for 30 minutes, and using purge and trap-gas chromatography/mass spectrometry, and Y in Equation 2 is an amount of ionic substances contained in the composition, which is obtained by measuring 50 mg of the film according to ASTM D 7359: 2008, wherein a moisture content of the film formed of the pressure-sensitive adhesive composition is 0.01 to 1.0 wt %, and the moisture content of the film is measured according to ASTM D3451-06 (2012) after maintaining 50 mg of the film under conditions of 25° C. and a relative humidity of 50% for 24 hours.

2. The pressure-sensitive adhesive film of claim 1, wherein the ionic substance is halogen ions.

3. The pressure-sensitive adhesive film of claim 1, wherein the pressure-sensitive adhesive resin has a halogen ion content of less than 300 ppm when measured according to ASTM D 7359:2008.

4. The pressure-sensitive adhesive film of claim 1, further comprising an organic solvent of which a boiling point is 100° C. or less.

5. The pressure-sensitive adhesive film of claim 1, wherein the photoinitiatior is a photo-radical initiator.

6. The pressure-sensitive adhesive film of claim 1, further comprising a tackifier resin having an acid value of 1 KOH mg/g or less.

7. The pressure-sensitive adhesive film of claim 6, wherein the tackifier resin is included at 5 to 100 parts by weight with respect to 100 parts by weight of the pressure-sensitive adhesive resin.

8. The pressure-sensitive adhesive film of claim 1, further comprising a silane coupling agent at less than 2 parts by weight with respect to 100 parts by weight of the pressure-sensitive adhesive resin.

9. An organic electronic device, comprising:
a substrate;
an organic electronic element formed on the substrate; and
the pressure-sensitive adhesive film of claim 1 encapsulating the organic electronic element.

10. The organic electronic device of claim 9, wherein the organic electronic element is an organic light emitting diode.

11. A method of preparing an organic electronic device, comprising applying the pressure-sensitive adhesive film of claim 1 on a substrate on which an organic electronic element is formed to cover the organic electronic element.

12. The pressure-sensitive adhesive film of claim 5, wherein the photo-radical initiator does not comprise a cationic initiator.

13. The pressure sensitive adhesive film of claim 1, further comprising a polyfunctional acrylate.

14. The pressure sensitive adhesive film of claim 6, wherein the tackifier resin comprises a hydrogenated terpene-based resin, a hydrogenated ester-based resin, or a hydrogenated dicyclopentadiene-based resin.

* * * * *